(12) United States Patent
Mulaosmanovic et al.

(10) Patent No.: US 12,159,935 B2
(45) Date of Patent: Dec. 3, 2024

(54) STRUCTURES FOR A FERROELECTRIC FIELD-EFFECT TRANSISTOR AND RELATED METHODS

(71) Applicant: GlobalFoundries Dresden Module One Limited Liability Company & Co. KG, Dresden (DE)

(72) Inventors: Halid Mulaosmanovic, Dresden (DE); Stefan Dünkel, Dresden (DE); Sven Beyer, Dresden (DE); Joachim Metzger, Dresden (DE); Robert Binder, Dresden (DE)

(73) Assignee: GlobalFoundries Dresden Module One Limited Liability Company & KG, County Dresden (DE)

( * ) Notice: Subject to any disclaimer, the term of this patent is extended or adjusted under 35 U.S.C. 154(b) by 102 days.

(21) Appl. No.: 17/861,482

(22) Filed: Jul. 11, 2022

(65) Prior Publication Data
US 2024/0014320 A1    Jan. 11, 2024

(51) Int. Cl.
*H01L 29/66* (2006.01)
*H01L 29/40* (2006.01)
*H01L 29/51* (2006.01)
*H01L 29/78* (2006.01)

(52) U.S. Cl.
CPC ...... *H01L 29/78391* (2014.09); *H01L 29/401* (2013.01); *H01L 29/516* (2013.01); *H01L 29/6684* (2013.01)

(58) Field of Classification Search
CPC ............. H01L 29/78391; H01L 29/401; H01L 29/516; H01L 29/6684; H01L 29/40111; H01L 29/4966

USPC ........................................................ 257/295
See application file for complete search history.

(56) References Cited

U.S. PATENT DOCUMENTS

| | | | |
|---|---|---|---|
| 2004/0135194 A1* | 7/2004 | Lee ................... | H10B 43/40 257/E21.679 |
| 2004/0190209 A1* | 9/2004 | Jozwiak ............. | H01L 27/0251 361/56 |
| 2006/0018066 A1* | 1/2006 | Litwin ................ | H01L 27/0288 361/56 |
| 2007/0072439 A1* | 3/2007 | Akimoto ............ | H01L 27/1225 438/795 |
| 2009/0072293 A1* | 3/2009 | Nam .................. | H10B 69/00 257/E21.209 |

(Continued)

OTHER PUBLICATIONS

European Patent Office, Extended European Search Report and Written Opinion issued in European Patent Application No. 23178042.0 on Nov. 22, 2023 (9 pages).

(Continued)

*Primary Examiner* — Sheikh Maruf
(74) *Attorney, Agent, or Firm* — Thompson Hine LLP

(57) ABSTRACT

Structures for a ferroelectric field-effect transistor and methods of forming a structure for a ferroelectric field-effect transistor. The structure comprises a gate stack having a ferroelectric layer, a first conductor layer, and a second conductor layer positioned in a vertical direction between the first conductor layer and the ferroelectric layer. The first conductor layer comprises a first material, the second conductor layer comprises a second material different from the first material, and the second conductor layer is in direct contact with the ferroelectric layer.

18 Claims, 1 Drawing Sheet

(56) References Cited

U.S. PATENT DOCUMENTS

| | | | | |
|---|---|---|---|---|
| 2011/0303965 | A1* | 12/2011 | Kim | H10B 41/49 |
| | | | | 257/321 |
| 2012/0074484 | A1* | 3/2012 | Kang | H10B 41/40 |
| | | | | 257/E21.422 |
| 2012/0156855 | A1* | 6/2012 | Sim | H01L 21/764 |
| | | | | 438/421 |
| 2014/0008712 | A1* | 1/2014 | Sim | H01L 29/788 |
| | | | | 257/365 |
| 2015/0054054 | A1* | 2/2015 | Ahn | H01L 29/42364 |
| | | | | 257/321 |
| 2017/0141235 | A1* | 5/2017 | Lai | H01L 29/6684 |
| 2017/0162702 | A1* | 6/2017 | Hu | H01L 29/42384 |
| 2018/0090591 | A1* | 3/2018 | Ando | H01L 29/66545 |
| 2018/0151745 | A1* | 5/2018 | Chang | H10B 51/30 |
| 2018/0151746 | A1* | 5/2018 | Tu | H01L 29/513 |
| 2018/0166453 | A1* | 6/2018 | Müller | H01L 28/60 |
| 2019/0066917 | A1* | 2/2019 | Nahar | H01G 4/30 |
| 2019/0067488 | A1* | 2/2019 | Tsai | H01L 29/66545 |
| 2019/0115354 | A1* | 4/2019 | Tan | H01L 29/42324 |
| 2019/0115461 | A1* | 4/2019 | Yonehara | H01L 29/42352 |
| 2019/0207009 | A1* | 7/2019 | Yamaguchi | H01L 29/6684 |
| 2019/0237470 | A1* | 8/2019 | Mine | H10B 51/30 |
| 2019/0252489 | A1* | 8/2019 | Lu | H01L 29/6684 |
| 2020/0013897 | A1* | 1/2020 | Park | H01L 21/82345 |
| 2020/0136382 | A1* | 4/2020 | Delshadpour | H02H 9/046 |
| 2020/0373291 | A1* | 11/2020 | Bakalski | H05K 9/0067 |
| 2020/0381559 | A1* | 12/2020 | Young | H01L 29/66636 |
| 2021/0005710 | A1* | 1/2021 | Park | H01L 29/42312 |
| 2021/0083068 | A1* | 3/2021 | Lin | H01L 27/0886 |
| 2021/0234362 | A1* | 7/2021 | Bouche | H02H 3/021 |
| 2021/0358924 | A1* | 11/2021 | Song | H01L 27/088 |
| 2021/0375890 | A1* | 12/2021 | Chia | H10B 51/30 |
| 2021/0376107 | A1* | 12/2021 | van Dal | H01L 29/40111 |
| 2022/0140104 | A1* | 5/2022 | Heo | H01L 29/513 |
| | | | | 257/295 |
| 2022/0238539 | A1* | 7/2022 | Lee | H10B 51/00 |
| 2022/0336498 | A1* | 10/2022 | Lai | H10B 51/20 |
| 2022/0344488 | A1* | 10/2022 | Huang | H01L 29/517 |

OTHER PUBLICATIONS

Xiong, K.; Robertson, J.; Pourtois, G.; Pétry, J.; Müller, M. "Impact of Incorporated Al on the TiN/HfO2 Interface Effective Work Function." Journal of Applied Physics, 104, 074501 (2008).

Lima, L. P. B.; Dekkers, H. F. W.; Lisoni, J. G.; Diniz, J. A.; Van Elshocht, S.; De Gendt, S. "Metal Gate Work Function Tuning by Al Incorporation in TiN." Journal of Applied Physics, 115, 074504 (2014).

Konashuk, A.S., Filatova, E.O., Sakhonenkov, S.S., Kolomiiets, N.M. and Afanas' ev, V.V., "Analysis of Oxygen and Nitrogen Redistribution at Interfaces of HfO2 with Laminate TiN/TiAl/TiN Electrodes." The Journal of Physical Chemistry C, 124(29), pp. 16171-16176 (2020).

Lee, Meng-Chien, Wei-Li Lee, Hung-Ru Lin, Guang-Li Luo, and Chao-Hsin Chien. "High-Interface-Quality Hf-based Gate Stacks on Si0. 5Ge0. 5 Through Aluminum Capping." IEEE Electron Device Letters, vol. 42, No. 12, pp. 1723-1726 (2021).

Shih, T. L.; Su, Y. H.; Kuo, T. C.; Lee, W. H.; Current, M. I. "Effect of Microwave Annealing on Electrical Characteristics of TiN/Al/TiN/HfO2/Si MOS Capacitors." Applied Physics Letters, 111, 012101 (2017).

Kim, Hyoungsub, et al., "Crystallization kinetics and microstructure-dependent leakage current behavior of ultrathin HfO2 dielectrics: In situ annealing studies." Applied Physics Letters 84, 2064; https://doi.org/10.1063/1.1667621 (2004).

P. D. Lomenzo et al., "Ferroelectric Si-Doped HfO2 Device Properties on Highly Doped Germanium," in IEEE Electron Device Letters, vol. 36, No. 8, pp. 766-768, doi: 10.1109/LED.2015.2445352 (Aug. 2015).

* cited by examiner

STRUCTURES FOR A FERROELECTRIC FIELD-EFFECT TRANSISTOR AND RELATED METHODS

BACKGROUND

The disclosure relates to semiconductor device fabrication and integrated circuits and, more specifically, to structures for a ferroelectric field-effect transistor and methods of forming a structure for a ferroelectric field-effect transistor.

A field-effect transistor generally includes a source, a drain, a semiconductor body supplying a channel region between the source and drain, and a gate electrode overlapped with the channel region. When a control voltage exceeding a characteristic threshold voltage is applied to the gate electrode, carrier flow occurs in the channel region between the source and drain to produce a device output current. A ferroelectric field-effect transistor is a metal-insulator-semiconductor field-effect transistor in which the gate dielectric is replaced by a layer containing a ferroelectric material. The threshold voltage of the ferroelectric field-effect transistor depends on the polarization state of the ferroelectric layer.

Improved structures for a ferroelectric field-effect transistor and methods of forming a structure for a ferroelectric field-effect transistor are needed.

SUMMARY

In an embodiment of the invention, a structure for a ferroelectric field-effect transistor is provided. The structure comprises a gate stack including a ferroelectric layer, a first conductor layer, and a second conductor layer positioned in a vertical direction between the first conductor layer and the ferroelectric layer. The first conductor layer comprises a first material, the second conductor layer comprises a second material different from the first material, and the second conductor layer is in direct contact with the ferroelectric layer.

In an embodiment of the invention, a method of forming a structure for a ferroelectric field-effect transistor is provided. The method comprises forming a gate stack including a ferroelectric layer, a first conductor layer, and a second conductor layer positioned in a vertical direction between the first conductor layer and the ferroelectric layer. The first conductor layer comprises a first material, the second conductor layer comprises a second material different from the first material, and the second conductor layer is in direct contact with the ferroelectric layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
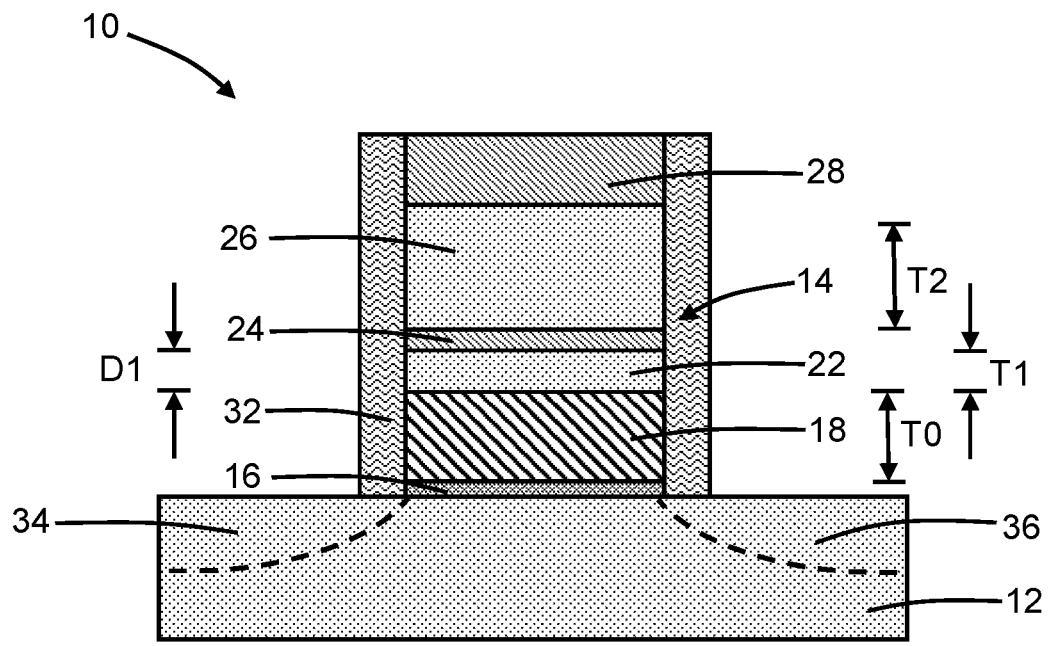
FIG. 1 is a cross-sectional view of a structure in accordance with embodiments of the invention.

With reference to FIG. 1 and in accordance with embodiments of the invention, a ferroelectric field-effect transistor 10 is formed using a semiconductor substrate 12 that is comprised of a semiconductor material, such as single-crystal silicon. The ferroelectric field-effect transistor 10 may be fabricated by front-end-of-line processing as a device structure in an active device region of the semiconductor substrate 12. The ferroelectric field-effect transistor 10 may include a multi-layer gate stack 14 that is positioned on the semiconductor substrate 12. The gate stack 14 may be formed by depositing a layer stack including thin films of the different materials and patterning the layer stack with photolithography and etching processes.

The gate stack 14 includes an interfacial layer 16 that is arranged on the semiconductor substrate 12 and a ferroelectric layer 18 that is arranged on the interfacial layer 16. The interfacial layer 16 is positioned in a vertical direction between the ferroelectric layer 18 and the semiconductor substrate 12. The interfacial layer 16 may be comprised of a dielectric material, such as silicon dioxide either grown or deposited, that is an electrical insulator. The ferroelectric layer 18 may be comprised of a ferroelectric material, such as a high-k dielectric material like hafnium oxide or zirconium oxide, that is deposited, for example, by atomic layer deposition. In an embodiment, the ferroelectric material of the ferroelectric layer 18, which is an electrical insulator, may have a permittivity that is greater than the permittivity of the dielectric material of the interfacial layer 16. The ferroelectric material constituting the ferroelectric layer 18 may be crystallized by an anneal following deposition. In an embodiment, the ferroelectric layer 18 may have a thickness T0 that is greater than or equal to 5 nanometers. In an embodiment, the ferroelectric layer 18 may be crystalline with an orthorhombic phase that is ferroelectric. In an embodiment, the thickness T0 of the ferroelectric layer 18 may be greater than or equal to 5 nanometers, and the ferroelectric layer 18 may be crystalline with an orthorhombic phase that is ferroelectric.

The gate stack 14 of the ferroelectric field-effect transistor 10 includes a gate electrode that is arranged on the ferroelectric layer 18. The gate electrode may include multiple conductor layers 22, 24, 26 in which the conductor layer 24 is disposed in a vertical direction between the conductor layer 22 and the conductor layer 26. The conductor layer 22 has an interface with the ferroelectric layer 18 and, in an embodiment, the conductor layer 22 may have a surface that is in direct contact with an adjacent surface of the ferroelectric layer 18. The conductor layer 24 has an interface with the conductor layer 22 and, in an embodiment, the conductor layer 24 may have a surface that is in direct contact with an adjacent surface of the conductor layer 22. The conductor layer 26 has an interface with the conductor layer 24 and, in an embodiment, the conductor layer 26 may have a surface that is in direct contact with an adjacent surface of the conductor layer 24. A conductor layer 28 comprised of, for example, doped polysilicon may be disposed on the conductor layer 26.

The conductor layer 24 is comprised of a different material than the conductor layer 22, and the conductor layer 24 is also comprised of a different material than the conductor layer 26. The conductor layer 22 and the conductor layer 26 may be comprised of the same material. In an embodiment, the conductor layer 22 and the conductor layer 26 may be comprised of a work function metal. In an embodiment, the conductor layer 22 and the conductor layer 26 may be comprised of titanium nitride. In an embodiment, the conductor layer 24 may be comprised of a metal that getters a reactive species, such as oxygen, that may be present in, or introduced into, the gate stack 14. In an embodiment, the conductor layer 24 may be comprised of aluminum. In an embodiment, the conductor layer 24 may exclusively contain aluminum.

In an embodiment, the conductor layer 22 may have a thickness T1 that is less than or equal to 0.5 nanometers and greater than or equal to 0.1 nanometers. The thickness T1 of the conductor layer 22 may be measured from the interface with the ferroelectric layer 18 to the interface with the conductor layer 24. The thickness T2 of the conductor layer 26 may be measured from the interface with the conductor layer 24 to the interface with the conductor layer 28. In an embodiment, the thickness T2 of the conductor layer 26 may be greater than the thickness T1 of the conductor layer 22. The thickness T0 of the ferroelectric layer 18 may be measured from the interface with the interfacial layer 16 to the interface with the conductor layer 22.

The conductor layer 24 may be located in close proximity to the ferroelectric layer 18 in order to prevent reactions between a reactive species, such as oxygen, and the material of the conductor layer 22. For example, the reactive species that is gettered by the conductor layer 24 may originate from the ferroelectric layer 18. In an embodiment, the conductor layer 24 may be positioned within a distance D1 of less than or equal 0.5 nanometers and greater than or equal to 0.1 nanometers from the ferroelectric layer 18 in order to provide the required gettering function. The distance D1 may be measured from the interface between the conductor layer 24 and the conductor layer 22 to the interface between the conductor layer 22 and the ferroelectric layer 18. The thickness T1 of the conductor layer 22 may be equal to the distance D1 between the conductor layer 24 and the ferroelectric layer 18. The gettering of the reactive species may prohibit the formation of a reacted layer at the interface between the conductor layer 22 and the ferroelectric layer 18, which promotes direct contact between the conductor layer 22 and the ferroelectric layer 18.

The ferroelectric material constituting the ferroelectric layer 18 is characterized by a pair of stable remanent polarization states that are persistent and that can be reversibly varied in response to an electric field applied from the gate electrode. The pair of stable remanent polarization states are appropriate for use as the logic states of a nonvolatile memory bitcell. The remnant polarization states of the ferroelectric material in the ferroelectric layer 18 determine threshold voltage shifts reflecting memory states stored by the ferroelectric field-effect transistor 10.

The ferroelectric field-effect transistor 10 includes sidewall spacers 32 comprised of a dielectric material, such as silicon nitride, that is conformally deposited and anisotropically etched. The ferroelectric field-effect transistor 10 includes source/drain regions 34, 36 may be formed by, for example, ion implantation in the semiconductor substrate 12. The gate stack 14 may operate to self-align the implantation, and the gate stack 14 may be arranged in a lateral direction between the source/drain region 34 and the source/drain region 36. The source/drain regions 34, 36 may be doped (e.g., heavily doped) with a concentration of a dopant, such as an n-type dopant (e.g., arsenic or phosphorus) that provides n-type conductivity. Alternatively, source/drain regions 34, 36 may be doped (e.g., heavily doped) with a concentration of a p-type dopant (e.g., boron) that provides p-type conductivity. As used herein, the term "source/drain region" means a doped region of semiconductor material that can function as either a source or a drain of a ferroelectric field-effect transistor.

Generally, the ferroelectric field-effect transistor 10 may exhibit a fast operation speed, low power requirements, and a non-destructive read capability as a memory device. The material of the conductor layer 24 may be chosen to be a getter for oxygen. The close proximity of the conductor layer 24 to the ferroelectric layer 18 may prevent the formation of an interfacial layer, such as a layer containing titanium, nitrogen, and oxygen, between the conductor layer 22 and the oxygen-containing ferroelectric layer 18. As a result, the ferroelectric field-effect transistor 10 may be characterized by a threshold voltage for each remnant polarization state that exhibits less shift with an increasing number of endurance cycles.

Figure 2:
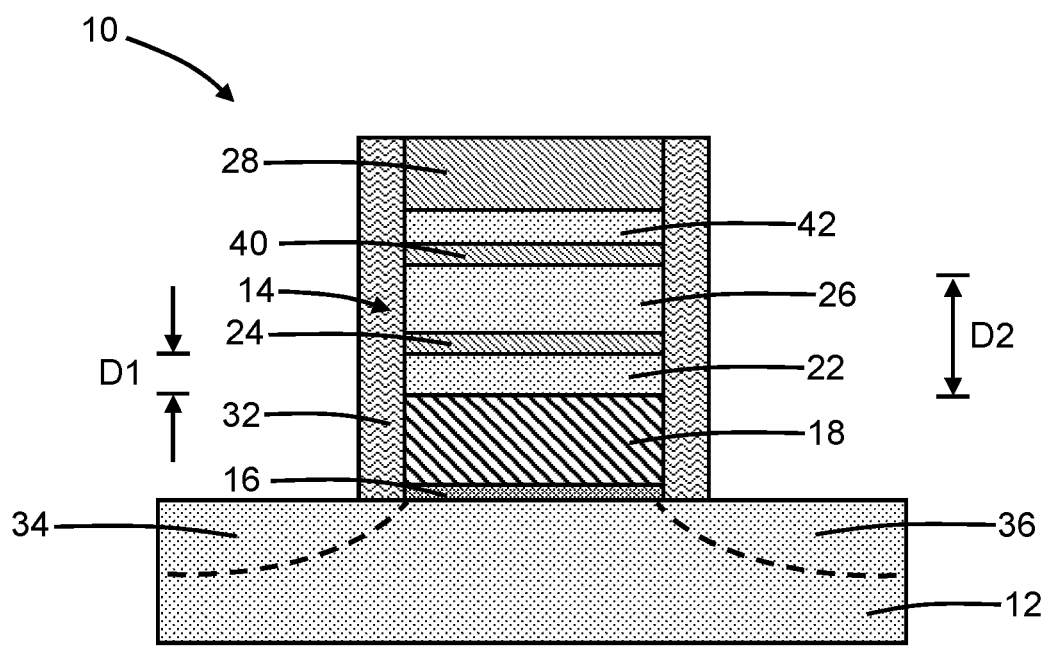
FIG. 2 is a cross-sectional view of a structure in accordance with alternative embodiments of the invention.

With reference to FIG. 2 and in accordance with alternative embodiments, a conductor layer 40 and a conductor layer 42 may be added to the gate electrode of the gate stack 14. The conductor layer 40 is disposed in a vertical direction between the conductor layer 26 and the conductor layer 42. The conductor layer 40 has an interface with the conductor layer 26 and, in an embodiment, the conductor layer 40 may have a surface that is in direct contact with an adjacent surface of the conductor layer 26. Similarly, the conductor layer 42 has an interface with the conductor layer 40 and, in an embodiment, the conductor layer 42 may have a surface that is in direct contact with a surface of the conductor layer 40.

The conductor layer 40 is comprised of a different material than the conductor layer 42. In an embodiment, the conductor layer 40 may be comprised of the same material (e.g., aluminum) as the conductor layer 24. In an embodiment, the conductor layer 42 may be comprised of the same material (e.g., titanium nitride) as the conductor layer 22 and the conductor layer 26.

The conductor layer 24 is positioned in closer proximity to the ferroelectric layer 18 than the conductor layer 40. In an embodiment, the conductor layer 40 may be positioned within a distance D2 of greater than or equal 1.5 nanometers from the ferroelectric layer 18. The distance D2 may be measured from the interface between the conductor layer 40 and the conductor layer 26 to the interface between the conductor layer 22 and the ferroelectric layer 18. The distance D2 is greater than the distance D1 between the conductor layer 24 and the ferroelectric layer 18. The conductor layer 40 may function as a getter to prevent reactions between the material of the conductor layer 42 and a reactive species, such as oxygen.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a ferroelectric field-effect transistor, the structure comprising:
    a gate stack including a ferroelectric layer, a first conductor layer, a second conductor layer positioned in a vertical direction between the first conductor layer and the ferroelectric layer, a third conductor layer, and a fourth conductor layer positioned in the vertical direction between the third conductor layer and the first conductor layer, the first conductor layer and the third conductor layer comprising a first material, the second conductor layer and the fourth conductor layer comprising a second material different from the first material, and the second conductor layer in direct contact with the ferroelectric layer, wherein the first conductor layer is positioned within a first distance of less than or equal to 0.5 nanometers and greater than or equal to 0.1 nanometers from the ferroelectric layer, the first material is aluminum, and the second material is titanium nitride.

2. The structure of claim 1 wherein the ferroelectric layer comprises hafnium oxide.

3. A structure for a ferroelectric field-effect transistor, the structure comprising:
    a gate stack including a ferroelectric layer, a first conductor layer, and a second conductor layer positioned in a vertical direction between the first conductor layer and the ferroelectric layer, the first conductor layer comprising a first material, the second conductor layer comprising a second material different from the first material, and the second conductor layer in direct contact with the ferroelectric layer, wherein the first conductor layer is positioned within a distance of less than or equal to 0.5 nanometers and greater than or equal to 0.1 nanometers from the ferroelectric layer.

4. The structure of claim 3 wherein the second conductor layer has thickness that is equal to the distance.

5. The structure of claim 1 wherein the fourth conductor layer is thicker than the second conductor layer.

6. The structure of claim 1 further comprising:
    a semiconductor substrate;
    a first source/drain region in the semiconductor substrate; and
    a second source/drain region in the semiconductor substrate,
    wherein the gate stack is positioned on the semiconductor substrate, and the gate stack is arranged in a lateral direction between the first source/drain region and the second source/drain region.

7. The structure of claim 1 wherein the ferroelectric layer has a thickness that is greater than or equal to 5 nanometers, and the ferroelectric layer is crystalline with an orthorhombic phase that is ferroelectric.

8. A method of forming a structure for a ferroelectric field-effect transistor, the method comprising:
    forming a gate stack including a ferroelectric layer, a first conductor layer, a second conductor layer positioned in a vertical direction between the first conductor layer and the ferroelectric layer, a third conductor layer, and a fourth conductor layer positioned in the vertical direction between the third conductor layer and the first conductor layer,
    wherein the first conductor layer and the third conductor layer comprise a first material, the second conductor layer and the fourth conductor layer comprise a second material different from the first material, the first conductor layer is positioned within a first distance of less than or equal to 0.5 nanometers and greater than or equal to 0.1 nanometers from the ferroelectric layer, the first material is aluminum, the second material is titanium nitride, and the second conductor layer is in direct contact with the ferroelectric layer.

9. The method of claim 8 wherein the ferroelectric layer comprises hafnium oxide, the first material is aluminum, and the second material is titanium nitride.

10. The method of claim 9 wherein the third conductor layer is positioned within a second distance of greater than or equal to 1.5 nanometers from the ferroelectric layer.

11. The structure of claim 1 further comprising:
    a fifth conductor layer disposed on the fourth conductor layer, the fifth conductor layer comprising doped polysilicon.

12. The structure of claim 11 wherein the third conductor layer is positioned within a second distance of greater than or equal to 1.5 nanometers from the ferroelectric layer.

13. The structure of claim 11 wherein the ferroelectric layer has a thickness that is greater than or equal to 5 nanometers.

14. The structure of claim 7 wherein the third conductor layer is positioned within a second distance of greater than or equal to 1.5 nanometers from the ferroelectric layer.

15. The structure of claim 1 wherein the third conductor layer is positioned within a second distance of greater than or equal to 1.5 nanometers from the ferroelectric layer.

16. The structure of claim 3 wherein the ferroelectric layer has a thickness that is greater than or equal to 5 nanometers, and the ferroelectric layer is crystalline with an orthorhombic phase that is ferroelectric.

17. The structure of claim 3 wherein the ferroelectric layer comprises hafnium oxide.

18. The structure of claim 3 further comprising:
a semiconductor substrate;
a first source/drain region in the semiconductor substrate; and
a second source/drain region in the semiconductor substrate,
wherein the gate stack is positioned on the semiconductor substrate, and the gate stack is arranged in a lateral direction between the first source/drain region and the second source/drain region.

\* \* \* \* \*